United States Patent
Furuuchi et al.

(10) Patent No.: US 8,475,554 B2
(45) Date of Patent: Jul. 2, 2013

(54) PERMEABLE MEMBER, AND PERMEABLE CASING AND ELECTRICAL COMPONENT USING THE SAME

(75) Inventors: Kouji Furuuchi, Osaka (JP); Hiroyuki Nishii, Osaka (JP)

(73) Assignee: Nitto Denko Corporation, Osaka (JP)

( * ) Notice: Subject to any disclaimer, the term of this patent is extended or adjusted under 35 U.S.C. 154(b) by 784 days.

(21) Appl. No.: 11/792,158

(22) PCT Filed: Dec. 1, 2005

(86) PCT No.: PCT/JP2005/022116
§ 371 (c)(1),
(2), (4) Date: Jun. 1, 2007

(87) PCT Pub. No.: WO2006/062029
PCT Pub. Date: Jun. 15, 2006

(65) Prior Publication Data
US 2008/0092741 A1   Apr. 24, 2008

(30) Foreign Application Priority Data
Dec. 7, 2004   (JP) .................... 2004-354637

(51) Int. Cl.
*B01D 46/00*   (2006.01)
(52) U.S. Cl.
USPC .............................. 55/385.4; 96/4
(58) Field of Classification Search
USPC ............ 55/410, 434, 466, 467, 521, 385.4, 55/385.6, 385.7, 504, 505, 524; 96/108, 243, 96/410, 4, 7–14; 454/254–255, 270–277; 362/345, 547
See application file for complete search history.

(56) References Cited

U.S. PATENT DOCUMENTS

| 4,981,940 A | * | 1/1991 | Konotsune et al. ............. 528/26 |
| 5,080,001 A | * | 1/1992 | Ishibashi et al. ............... 454/370 |

(Continued)

FOREIGN PATENT DOCUMENTS

| EP | 1 363 484 A2 | 11/2003 |
| JP | 26-180191 | 8/1987 |

(Continued)

OTHER PUBLICATIONS

Microfilm of the specification and drawings annexed to the request of Japanese Utility Model Application No. 158658/1986 (Laid-open No. 64994/1988) (Toyoda Machine Works, Ltd.), Apr. 28, 1988, Full text; all drawings (Family: none).

*Primary Examiner* — Duane Smith
*Assistant Examiner* — Thomas McKenzie
(74) *Attorney, Agent, or Firm* — Hamre, Schumann, Mueller & Larson, P.C.

(57) ABSTRACT

The present invention provides a permeable member which can attain both a pullout strength and following property (sealing property) and provides a permeable casing and an electrical component using the permeable member. The present invention includes a permeable film through which a gas passing an opening passes when the permeable film is fixed to the opening of a casing, and a tubular support that supports the permeable film. The support includes a first resin part that contacts the casing with the support fixed to the opening, and a second resin part composed of a material having a higher elastic modulus than that of a material constituting the first resin part, and the first resin part and the second resin part are laminated at least partly in a transverse section of the support.

11 Claims, 12 Drawing Sheets

U.S. PATENT DOCUMENTS

| | | | |
|---|---|---|---|
| 5,843,573 A * | 12/1998 | Itoh et al. | 428/364 |
| 5,914,415 A * | 6/1999 | Tago | 55/385.4 |
| 6,063,152 A * | 5/2000 | Teter | 55/385.1 |
| 6,364,924 B1 * | 4/2002 | Mashiko et al. | 55/385.4 |
| 6,468,332 B2 * | 10/2002 | Goglio et al. | 96/134 |
| 6,521,024 B1 * | 2/2003 | Akahori et al. | 96/4 |
| 6,699,118 B1 * | 3/2004 | Wahner et al. | 454/20 |
| 6,994,621 B2 * | 2/2006 | Mashiko et al. | 454/270 |
| 7,083,660 B2 * | 8/2006 | Hara et al. | 55/385.4 |
| 7,116,024 B2 * | 10/2006 | Berwert et al. | 310/89 |
| 7,357,709 B2 * | 4/2008 | Zukor et al. | 454/270 |
| 2002/0017208 A1 * | 2/2002 | Kasai et al. | 101/375 |
| 2002/0022687 A1 * | 2/2002 | Hikita et al. | 524/528 |
| 2002/0090506 A1 * | 7/2002 | Protzner et al. | 428/334 |
| 2003/0003857 A1 * | 1/2003 | Shimagaki et al. | 451/534 |
| 2003/0051451 A1 * | 3/2003 | Kusunose et al. | 55/320 |
| 2003/0216119 A1 * | 11/2003 | Mashiko et al. | 454/275 |
| 2004/0227343 A1 | 11/2004 | Takagi et al. | |

FOREIGN PATENT DOCUMENTS

| | | |
|---|---|---|
| JP | 62-180191 A | 8/1987 |
| JP | 63-64994 U | 4/1988 |
| JP | 11-215936 | 8/1999 |
| JP | 11-215936 A | 8/1999 |
| JP | 2001-143524 | 5/2001 |
| JP | 2001-143524 A | 5/2001 |
| JP | 2004-047425 A | 2/2004 |
| JP | 2004-263866 | 9/2004 |
| JP | 2004-263866 A | 9/2004 |

\* cited by examiner

PERMEABLE MEMBER, AND PERMEABLE CASING AND ELECTRICAL COMPONENT USING THE SAME

TECHNICAL FIELD

The present invention relates to a permeable member that is fixed to a casing of an electrical component or the like, ensures ventilation between the inside and outside of the casing and prevents the foreign objects from intruding into the casing, and relates to a permeable casing and an electrical component to which the permeable member is fixed.

BACKGROUND ART

Conventionally, a permeable member is attached to electrical components for a vehicle, such as a lamp, pressure sensor and ECU (Electrical Control Unit), and to casings of electric appliances, such as a mobile-phone and camera. The permeable member ensures ventilation between the inside and outside of the casing and prevents the foreign objects from intruding into the casing. Attaching the permeable member to the casing enables a pressure change inside of the casing accompanying a temperature change to be alleviated, sounds to be transmitted between the inside and outside of the casing and a gas generated in the casing to be discharged to outside, while preventing water, dust and the like from intruding into the casing.

One example of such a permeable member is disclosed in JP2001-143524A. The permeable member 101 disclosed in JP2001-143524A is provided with a tubular support 103 wherein a permeable film 102 is arranged on its end face and with a protective cover 104 that has a bottom and is fitted into the support 103 so that the protective cover 104 covers the permeable film 102, as shown in FIG. 20. The permeable member 101 is fixed to a casing 105 so as to cover an opening 106 of the casing 105. In this case, when using the support 103 that has a smaller inside diameter than an outside diameter of the opening 106, the permeable member 101 can be fixed to the casing 105 using an elastic force generated by extension of the support 103. In this publication, an elastomer is exemplified as a material for the support 103.

For the purpose of preventing a permeable member from coming off from a casing, that is to say for the purpose of enhancing a pullout strength of the member, a large elastic modulus of the support is preferable. However, when the elastic modulus becomes excessively large, it becomes difficult to ensure the sealing property between the casing and the permeable member since the support can not follow the unevenness present on the surface of the opening. In order to enhance the pullout strength while the sealing property of the permeable member is maintained, a radial thickness of the support may be thickened more than the conventional thickness, or a ratio of the inside diameter of the support relative to the outside diameter of the opening may be smaller than a conventional ratio.

However, if the radial thickness of the support is set to be large, the size of the permeable member becomes large and it may affect packaging of the casing to which the permeable member is fixed. In particular, an influence on the electrical component, which is demanded to be downsized, is great. If the ratio of the inside diameter of the support relative to the outside diameter of the opening is set to be small, the size of the permeable member can be maintained but a permeable area of the permeable film that is attached to an end face of the support decreases, which affects the permeation characteristics. In addition, a deformation amount of the support for fixing it to the casing becomes large and thereby the permeable film supported by the support may be deformed.

It is an object of the present invention to provide a permeable member which can attain both a pullout strength and following property (sealing property) by including a support with a nonconventional constitution, and to provide a permeable casing and an electrical component, using the permeable member.

DISCLOSURE OF INVENTION

The permeable member of the present invention includes a permeable film through which a gas passing an opening of a casing passes when the permeable film is fixed to the opening, and a tubular support that supports the permeable film. The support includes a first resin part that contacts the casing with the support fixed to the opening, and a second resin part composed of a material having a higher elastic modulus than that of a material constituting the first resin part. The first resin part and the second resin part are laminated at least partly in a transverse section of the support.

The permeable casing of the present invention includes an opening to which a permeable member is fixed, and the permeable member is the above-mentioned permeable member of the present invention.

The electrical component of the present invention is an electrical component provided with a casing, and the above permeable member is fixed to an opening of the casing.

According to the present invention, the permeable member is provided with the support that includes two or more resin materials being different from each other in elastic modulus, and thereby both the pullout strength and following property (sealing property) of the permeable member can be attained.

BEST MODE FOR CARRYING OUT THE INVENTION

Hereinafter embodiments of the present invention will be described in reference to the drawings. In the following description, the same numerals will be used for the same members, and repeated explanations thereof will be omitted in some case.

Figure 1:
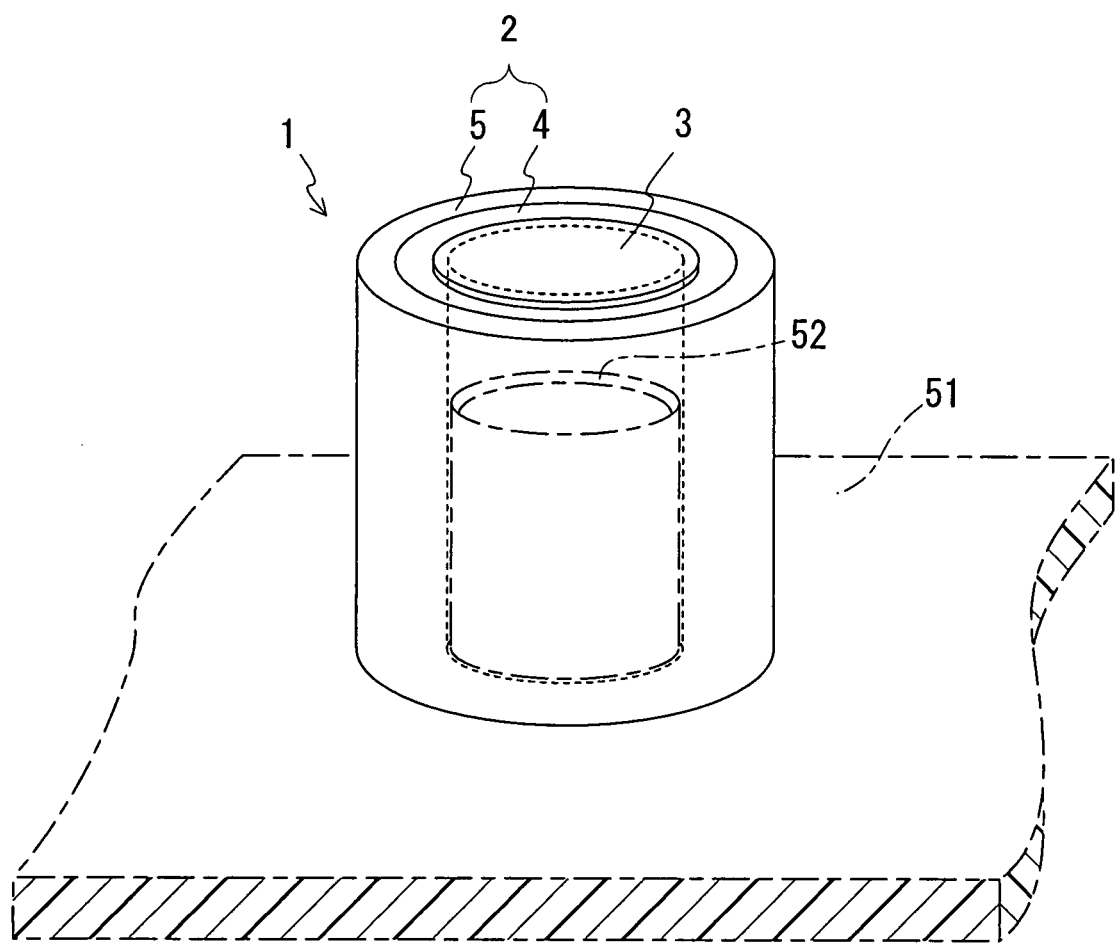
FIG. 1 is a perspective view showing one example of the permeable member of the present invention in a simplified manner.
Figure 2:
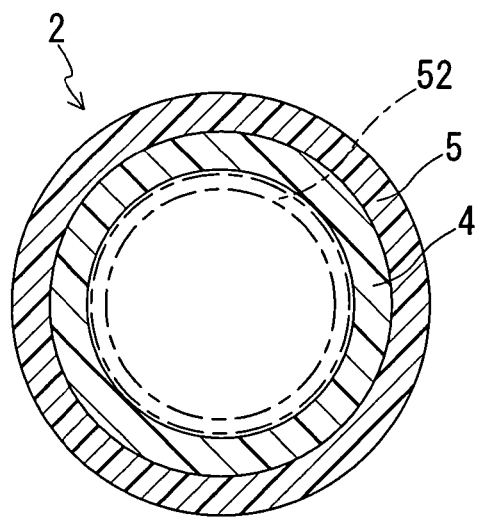
FIG. 2 is a sectional view showing a transverse section of the support of the permeable member of FIG. 1 in a simplified manner.

One example of the permeable member of the present invention is shown in FIG. 1. The permeable member 1 shown in FIG. 1 is provided with a permeable film 3 and a tubular support 2 that supports the permeable film 3. The support 2 is fixed to an opening 52 of a casing 51 so as to cover the opening 52. As shown in FIG. 2, the support 2 is provided with a first resin part 4 that contacts the opening 52 of the casing 51 with the support 2 fixed to the opening 52, and a second resin part 5 composed of a material having a higher elastic modulus than that of a material constituting the first resin part 4. The first resin part 4 and the second resin part 5 are laminated along the whole circumference in a transverse section of the support 2. FIG. 2 is a sectional view showing a transverse section of the support 2 shown in FIG. 1, and "transverse section" means a plane formed by cutting the support 2 with a plane perpendicular to a central axis of the support 2.

In the permeable member 1, the first resin part 4, which is composed of a resin material A having a relatively small elastic modulus, is arranged on a contact portion of the support 2. The support 2 is in contact with the casing 51 on the contact portion. Therefore, a reduction in the ability of the support 2 to follow the surface (fixing surface) of the casing 51 on which the permeable member 1 is fixed can be inhibited, and the sealing property of the permeable member 1 can be ensured. A decrease in the waterproof property and dust resistance of the casing 51 can be inhibited as well. In addition, in the permeable member 1, the support 2 is composed of a resin material B having a relatively high elastic modulus along with the resin material A. Therefore, the elastic force of the support 2 is increased compared to the case where a support is composed of only a resin material having a small elastic modulus, and thereby the pullout strength of the support 2 can be ensured. Ensuring the pullout strength enables prevention of the permeable member from dropping off the casing. As described above, a permeable member having both the pullout strength and following property (sealing property) can be constituted without thickening the radial thickness of the support 2 or reducing a ratio of the inside diameter of the support 2 relative to the outside diameter of the opening 52. Further, regarding the permeable member 1, the deformation amount of the support 2 when the support 2 is fixed to the casing 51 can be reduced, and therefore the deformation of the permeable film 3 can be inhibited.

The elastic modulus of the material (resin material A) constituting the first resin part 4 and the elastic modulus the material (resin material B) constituting the second resin part 5 are not particularly limited as long as the elastic modulus of resin material A is smaller than the elastic modulus of resin material B. Hence, these elastic moduli may be selected arbitrarily depending on required properties of the support 2. For example, the elastic modulus of the resin material B may be in the range of around $1 \times 10^8$ N/m$^2$ to $50 \times 10^8$ N/m$^2$ in terms of a flexural modulus, and the flexural modulus of the resin material A may be in the range of around 5 to 80% of the flexural modulus of the resin material B.

The resin material A is not particularly limited as long as the sealing property of the permeable member 1 can be ensured. For example, a rubber and a thermoplastic resin may be used. In the light of the moldability, a thermoplastic resin is preferably used. For example, various thermoplastic elastomers such as an olefin-based, styrene-based, urethane-based, ester-based, amide-based, and vinyl chloride-based elastomer, and various thermoplastic resins such as polyolefin, polyamide, polyester, polyacetal, polysulfone, polyacryl, and polyphenylene sulfide, or a composite thereof may be used. Among these, the thermoplastic elastomer is preferably used as the resin material A since the sealing property can be ensured more. The resin material B is not particularly limited as long as the resin material B has a higher elastic modulus than that of the resin material A. Materials similar to those of resin material A may be used for the resin material B.

The structure of the support 2 is not particularly limited, as long as the first resin part 4 is arranged so as to contact with the casing 51 (the opening 52 of the casing 51) with the support fixed to the opening 52, and the first resin part 4 and the second resin part 5 are laminated at least partly in the transverse section of the support 2, that is to say, as long as there exist a portion where the first resin part 4 and the second resin part 5 are overlapped each other in the radial direction of the support 2 when the transverse section of the support 2 is considered.

Figure 3:
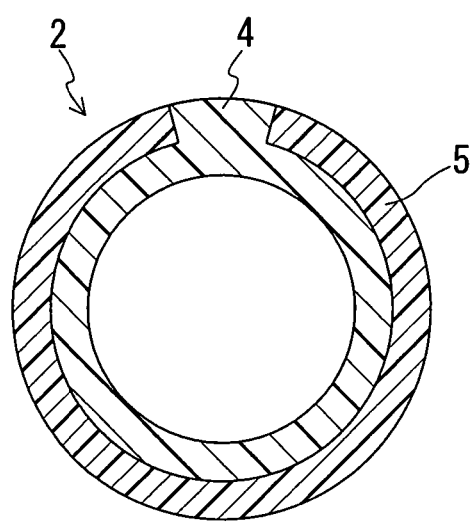
FIG. 3 is a sectional view showing one example of the support of the permeable member of the present invention in a simplified manner.

For example, as shown in FIG. 2, the support 2 may be a laminate of the ring-shaped first resin part 4 and the ring-shaped second resin part 5 in the transverse section. This support 2 has a structure in which the first resin part 4 and the second resin part 5 are laminated along the whole circumference in the transverse section. Further, as shown in FIG. 3, the support 2 may be a laminate of the second resin part 5 having a shape (C-shaped) in which one portion in the circumferential direction is lacking and a first resin part 4 has a portion (convex portion) that fits this lacking portion, in the transverse section. This support 2 has a structure in which the first resin part 4 and the second resin part 5 are laminated partly in the transverse section. In order to ensure the pullout strength more securely, it is preferable that the first resin part 4 and the second resin part 5 are laminated along the whole circumference in the transverse section.

Figure 4:
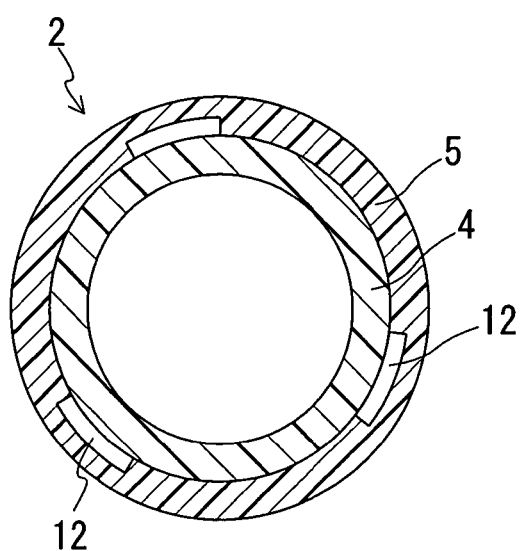
FIG. 4 is a sectional view showing another example of the support of the permeable member of the present invention in a simplified manner.

A space may be formed between the first resin part 4 and the second resin part 5 in a part of the transverse section. For example, as shown in FIG. 4, in the support 2, a space 12 may be formed between the first resin part 4 and the second resin part 5 by a concave portion formed in a part of the inner circumference plane of the second resin part 5. In the case where certain kinds of the resin material A and/or the resin material B are used, it is possible to control a balance between the pullout strength and sealing property of the permeable member 1 more precisely by forming the space 12. This space 12 may be formed by forming a concave portion and/or a convex portion in a part of the outer circumference plane of the first resin part 4 and/or a part of the inner circumference plane of the second resin part 5. The support 2 shown in FIG. 4 has a structure in which the first resin part 4 and the second resin part 5 are laminated partly in the transverse section.

Figure 5:
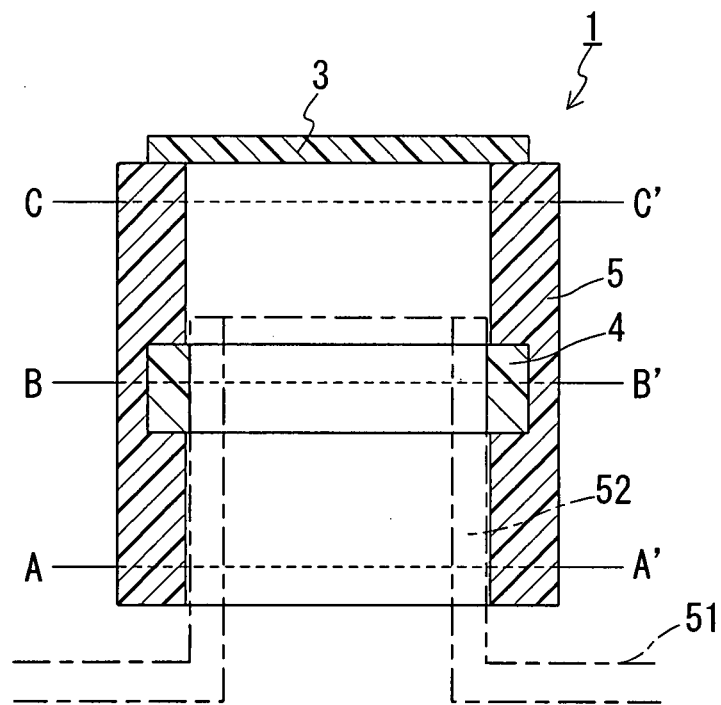
FIG. 5 is a sectional view showing another example of the permeable member of the present invention in a simplified manner.

The support 2 does not have to satisfy the above-described condition in all transverse sections thereof. Regarding the support 2 of the permeable member 1 shown in FIG. 5, the above-described condition is satisfied only in the transverse section B-B' out of transverse sections A-A', B-B' and C-C', and such a support 2 also can attain both the pullout strength and sealing property.

Figure 6:
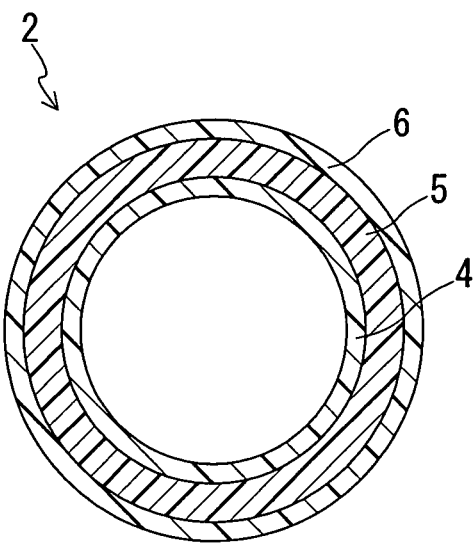
FIG. 6 is a sectional view showing yet another example of the support of the permeable member of the present invention in a simplified manner.

Regarding the supports 2 shown in FIG. 1 to FIG. 5, the first resin part 4 and the second resin part 5 are laminated one-to-one, but the numbers of the first resin part 4 and the second resin part 5 to be laminated are not particularly limited. In addition, the support 2 may contain a resin part besides the first resin part 4 and the second resin part 5. As shown in FIG. 6, the support 2 may be a laminate in which a ring-shaped first resin part 4, second resin part 5 and third resin part 6 are laminated in this order in the transverse section. In this case, if an elastic modulus of a material constituting the third resin part 6 is set to be smaller than the elastic modulus of the second resin part 5, for example, by using the same material for the material constituting the third resin part 6 as the material constituting the first resin part 4, and the like, it is possible to carry out the after-mentioned placement of the protective cover more steadily. The resin part other than the first resin part 4 and the second resin part 5 also may be interposed between the resin parts 4 and 5.

Figure 7:
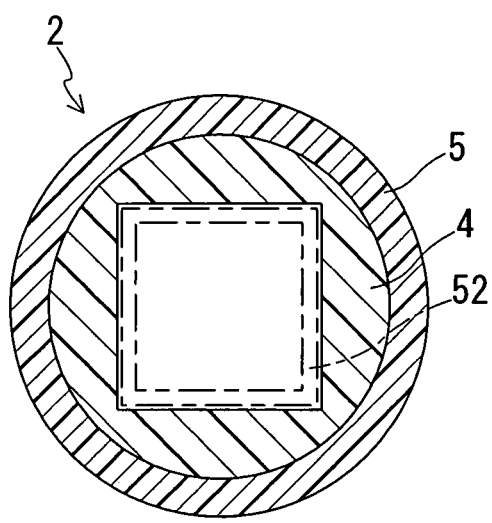
FIG. 7 is a sectional view showing still yet another example of the support of the permeable member of the present invention in a simplified manner.

The shape of the support 2 is not particularly limited as long as the shape is tubular. The shape may be cylindrical as shown in FIG. 1, or may be elliptical cylindrical or rectangular tubular. The shape of the outer circumference may be different from the shape of the inner circumference. As shown in FIG. 7, the support 2 may have an outer circumference that is cylindrical and an inner circumference that is rectangular tubular. The support 2 shown in FIG. 7 can be fixed to the opening 52 whose outer circumference is rectangular tubular.

Figure 8:
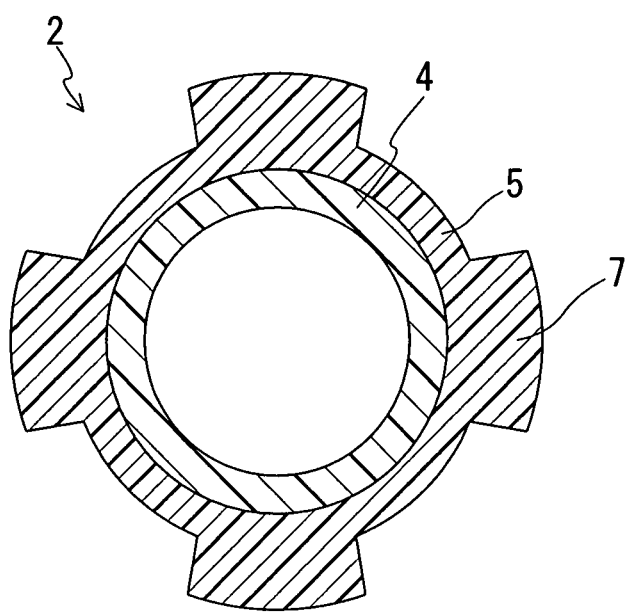
FIG. 8 is a sectional view showing one example of the support, other than the above supports, of the permeable member of the present invention in a simplified manner.
Figure 9:
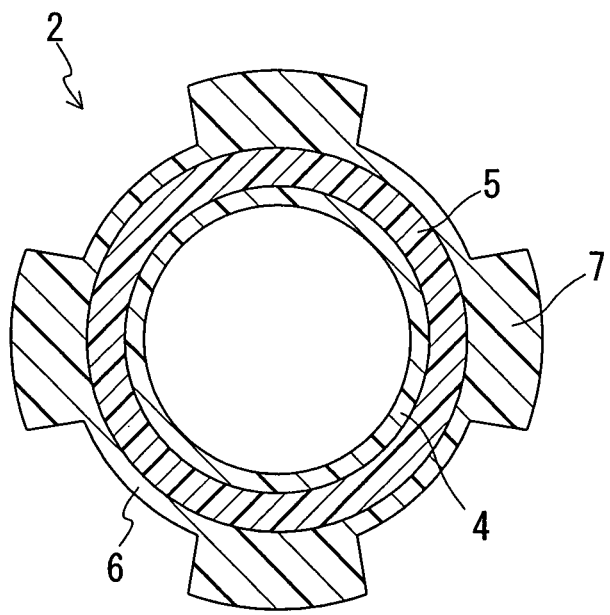
FIG. 9 is a sectional view showing one example of the support, other than the above supports, of the permeable member of the present invention in a simplified manner.

As shown in FIG. 8 and FIG. 9, in the support 2, a convex portion 7 may be formed in the outer circumference. This convex portion 7 can support a protective cover described later, for example. The convex portion 7 may be formed in the second resin part 5 as shown in FIG. 8 or the third resin part 6 as shown in FIG. 9. When the convex portion 7 is formed in the third resin part 6, it is preferable that the elastic modulus of the material constituting the third resin part 6 is set to be smaller than the elastic modulus of the material constituting the second resin part 5, for example, by using the same material for the material constituting the third resin part 6 as the material constituting the first resin part 4. The shape and the number of the convex portion 7 are not particularly limited.

The size of the support 2 is not particularly limited, and may be selected arbitrarily depending on the required properties of the permeable member 1.

Figure 10:
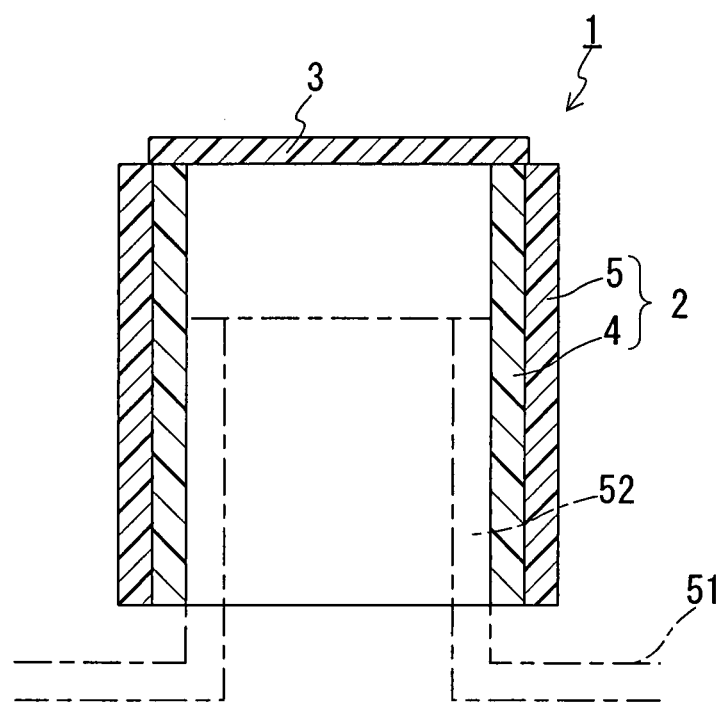
FIG. 10 is a sectional view showing a vertical plane of the permeable member of FIG. 1 in a simplified manner.

A method for fixing the permeable member 1 to the opening 52 is not particularly limited. The permeable member 1 may be fixed so as to cover the opening 52, or may be fixed by inserting the permeable member 1 into the opening 52. When the permeable member 1 is fixed so as to cover the opening 52, the support 2 in which the first resin part 4 is arranged as the inner layer, as shown FIG. 2, may be used. The permeable member 1 using this support 2 can be fixed to the casing 51 so as to cover the opening 52, as shown in FIG. 10. In this case, the inside diameter of the support 2 is preferably slightly smaller than the outside diameter of the opening 52.

Figure 11:
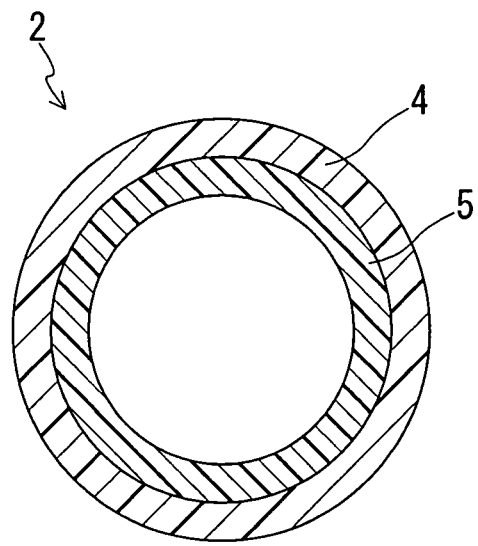
FIG. 11 is a sectional view showing one example of the support, other than the above supports, of the permeable member of the present invention in a simplified manner.
Figure 12:
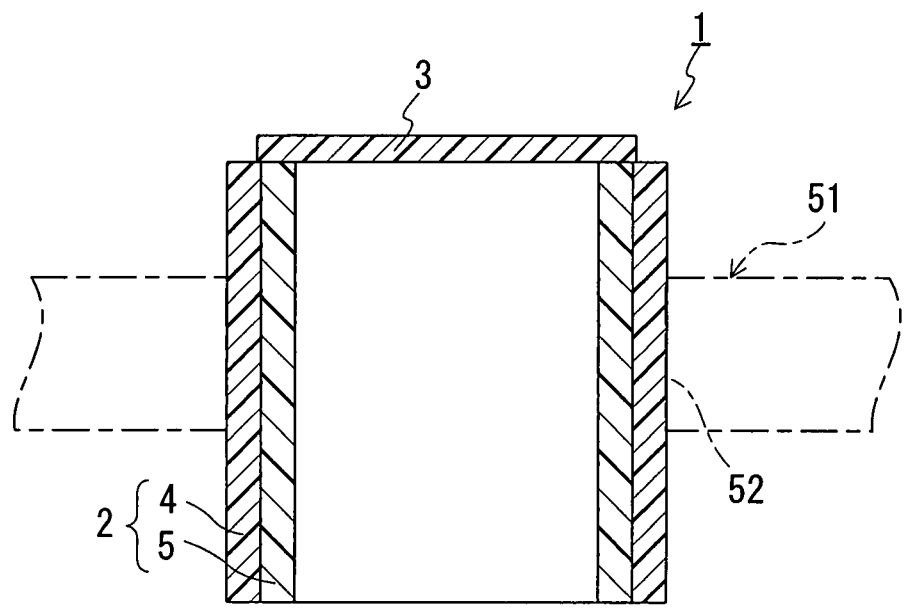
FIG. 12 is a sectional view showing yet another example of the permeable member of the present invention in a simplified manner.

When the permeable member 1 is fixed by inserting the permeable member 1 into the opening 52, the support 2 in which the first resin part 4 is arranged as the outer layer, as shown FIG. 11, may be used. The permeable member 1 using this support 2 can be fixed to the casing 51 by inserting the permeable member 1 into the opening 52, as shown in FIG. 12. In this case, the outside diameter of the support 2 is preferably slightly larger than the inside diameter of the opening 52.

A method for producing the support 2 is not particularly limited. For example, the support 2 can be produced using a method such as injection molding or tube extrusion molding. With respect to the injection molding method, by an integral molding, two-color molding (or multicolor molding) or double molding (or the multiple molding), a laminate in which the resin parts that are different from each other in elastic modulus are combined can be formed. When the integral molding is employed, the resin part for an inner layer may be molded first using a mold, the molded resin part may be loaded in another mold and then a resin part for an outer layer may be molded, for example.

With respect to the tube extrusion molding method, the support 2 can be formed by producing a multilayer tube including the resin parts that are different from each other in elastic modulus by the double extrusion molding (or the multiple extrusion molding), and by cutting the multilayer tube into a predetermined length.

For further example, the support 2 may be formed by laminating the first resin part 4 and the second resin part 5, which are molded separately. Specifically, the support 2 may be formed by inserting a resin part for an inner layer into a resin part for an outer layer, for example. In this case, deformation of the support 2 formed can be prevented by employing a slightly larger outside diameter of the resin part for the inner layer than the inside diameter of the resin part for the outer layer.

The material and the structure of the permeable film 3 are not particularly limited as long as they can ensure a suitable air permeation amount. For example, the permeable film 3 may contain a woven fabric, a nonwoven fabric, a net, a porous material, or a foam, for example. Among these, from the aspect of the water repellency (waterproof property), heat resistance, chemical resistance, and the like, the permeable film 3 preferably contains a porous material of a fluororesin. As the fluororesin, for example, polytetrafluoroethylene (PTFE), polychlorotrifluoroethylene, tetrafluoroethylene-hexafluoropropylene copolymer, tetrafluoroethylene-perfluoroalkylvinyl copolymer, tetrafluoroethylene-ethylene copolymer, polyvinylidene fluoride (PVdF) and the like may be used. In particular, an expanded PTFE porous material, which can maintain an air permeability even in small area and has high capability of preventing foreign objects such as water and dust from intruding into the casing, preferably is used. When the porous material of the fluororesin is used for the permeable film 3, it is preferable that the average pore size of the porous material is in the range of around 0.01 μm to 10

μm, in light of the waterproof property. Such a porous material can be obtained by usual methods for forming a porous material such as an expansion method and an extraction method.

A reinforcing layer may be laminated with the permeable film 3. The material and the structure of the reinforcing layer are not particularly limited, and the reinforcing layer preferably has a larger air permeability than that of the permeable film 3. For the reinforcing layer, for example, a woven fabric, a nonwoven fabric, a mesh, a net, a sponge, a foam, a porous material, and the like may be used. For the material of the reinforcing layer, a resin and a metal may be used, and the material may be selected arbitrarily depending on the required properties. It should be noted that the reinforcing layer simply may be overlaid with the permeable film 3, or the reinforcing layer and the permeable film 3 may be bonded to each other. The bonding may be carried out with a method such as adhesive lamination, heat lamination, heat welding, or ultrasonic welding. The number of the reinforcing layer to be laminated with permeable film 3 is not particularly limited.

The permeable film 3 may be a liquid-repellent treated film, such as a water-repellent treated film or oil-repellent treated film. The liquid-repellent treated film may be produced, for example, by applying a substance having a small surface tension onto the permeable film 3, then drying and curing it. A liquid-repellent agent used for the liquid-repellent treatment is not particularly limited as long as a coating having a smaller surface tension than that of the permeable film can be formed on the surface of the permeable film. For example, a solution containing a polymer material having a perfluoroalkyl group may be used for the agent. For the application of the liquid-repellent agent onto the permeable film 3, an impregnating method or a spraying method may be employed.

The air permeability of the permeable film 3 may be selected arbitrarily depending on required properties of the permeable member 1. In particular, the air permeability is preferably 1000 seconds or less and more preferably 100 seconds or less, in terms of Gurley number. It should be noted that the lower limit of the Gurley number is not particularly limited and may be, for example, 0.05 seconds or more. The Gurley number may be determined according to JIS P 8117 (1998) and, if necessary, may be determined by the conversion from Frazil air permeability determined according to JIS L 1096 (1999).

With respect to the support 2, the position where the permeable film 3 is arranged is not particularly limited. When the permeable film 3 is arranged on an end face of the support 2, the permeable member 1 can be manufactured more easily.

The permeable film 3 may be fixed and bonded to the support 2 by a method such as heat welding, ultrasonic welding, or bonding with an adhesive. In the light of easy operation, it is preferable to employ the heat welding or ultrasonic welding. When the reinforcing layer is laminated with the permeable film 3, damage to the permeable film 3 during fixing and bonding may be minimized by fixing and bonding the reinforcing layer to the support 2. It should be noted that if the high liquid repellency is required for the permeable film 3, the permeable film 3 may be fixed and bonded so that the surface having higher liquid repellency faces to the outside of the casing when the permeable member 1 is fixed to the casing 51.

The support 2 may integral-molded with the permeable film 3, when molded.

Figure 13:
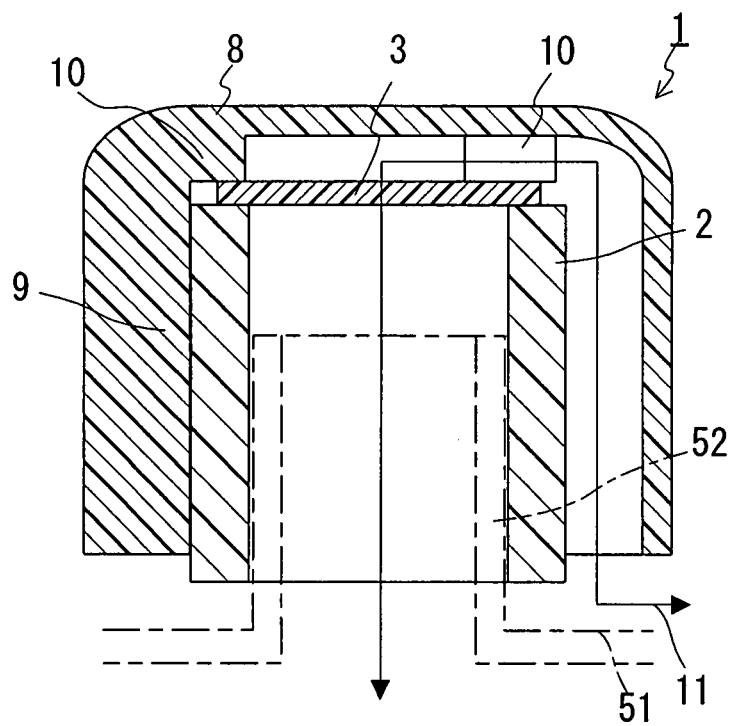
FIG. 13 is a sectional view showing still yet another example of the permeable member of the present invention in a simplified manner.

Another example of the permeable member 1 of the present invention is shown in FIG. 13. The permeable member 1 shown in FIG. 13 further includes a protective cover 8 that has a bottom and covers the permeable film 3. The protective cover 8 is supported by the support 2 so that a space is formed between the permeable film 3 and the protective cover 8 and thereby a gas pathway 11 is ensured. It is possible to prevent the breakage of the permeable film 3, since the protective cover 8 make it difficult for outside foreign objects, such as scattered stones, dust and water, to contact the permeable film 3.

A method for supporting the protective cover 8 is not particularly limited. In the permeable member 1 of FIG. 13, a convex portion 9 is formed in the inner circumference of the protective cover 8, and the protective cover 8 is fixed to the support 2 by bringing the convex portion 9 into contact with the support 2. In this case, it is preferable that an elastic modulus of a material constituting a resin part (a resin part supporting protective cover 8) in the support 2, which contacts the convex portion 9 is smaller than that of the material constituting the second resin part 5. The protective cover 8 can be fixed more steadily. One example of the protective cover 8 in which the convex portions 9 are formed in its inner circumference is shown in FIG. 14.

Figure 15:
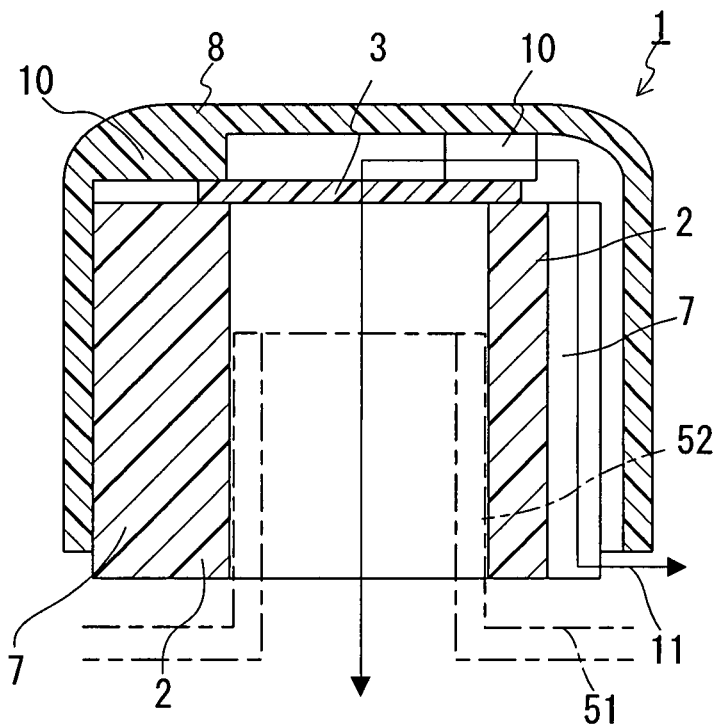
FIG. 15 is a sectional view showing one example of the permeable member, other than the above permeable members, of the present invention in a simplified manner.

In the permeable member 1 shown in FIG. 15, the protective cover 8 is supported and fixed by a convex portion 7 formed in the outer circumference of the support 2. In this case, the elastic modulus of the material constituting the resin part (the resin part supporting the protective cover 8), in which the convex portion 7 is formed is preferably smaller than that of the material constituting the second resin part 5, as described above.

As explained above, the protective cover 8 can be fixed by forming a convex portion in the inner circumference of the protective cover 8 and/or the outer circumference of the support 2. In order to fix protective cover 8 more steadily, it is preferable that 2 or more, further preferably three or more, convex portions are formed in the inner circumference of the protective cover 8 and/or the outer circumference of the support 2.

Figure 14:
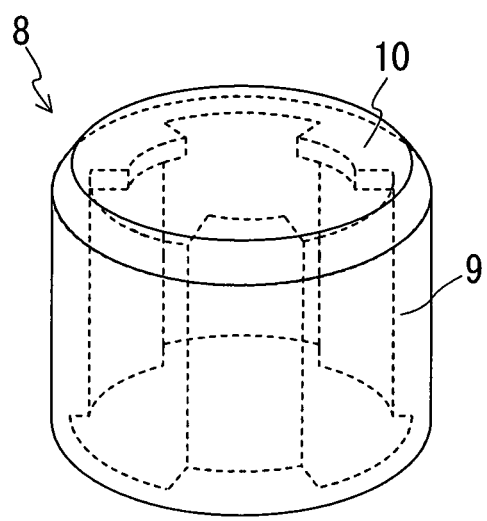
FIG. 14 is a perspective view showing the protective cover of the permeable member of FIG. 13.
Figure 16:
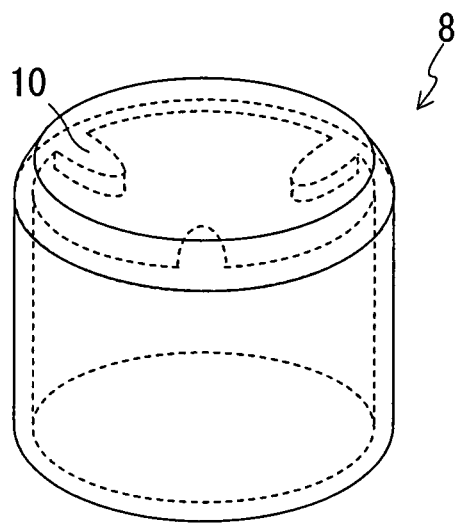
FIG. 16 is a perspective view showing the protective cover of the permeable member of FIG. 15.

As shown in FIG. 14 and FIG. 16, a convex stopper 10 may be formed in the inner face of the bottom of the protective cover 8. This convex stopper 10 enables the position of the protective cover 8 to be determined more surely to assure a gas pathway 11. The number and the shape of the convex stopper 10 are not particularly limited, and it is preferable that two or more, further preferably three or more, convex stoppers 10 are formed in order to assure the gas pathway 11 with more certainly.

Figure 17:
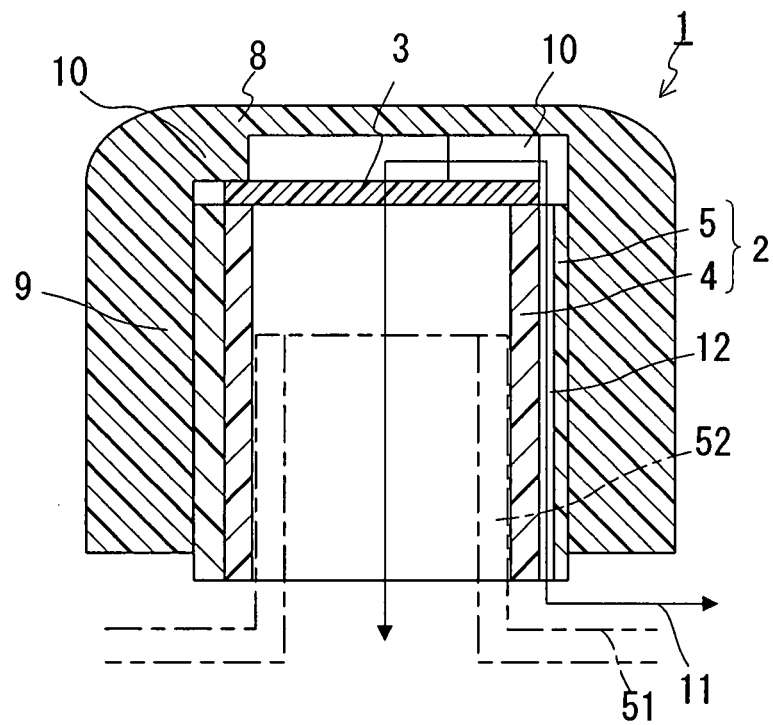
FIG. 17 is a sectional view showing one example of the permeable member, other than the above permeable members, of the present invention in a simplified manner.

When the permeable member 1 is provided with the protective cover 8 that has a bottom and covers the permeable film 3, and with the support 2 in which the space 12 is formed between the first resin part 4 and the second resin part 5 as shown in FIG. 4, the space 12 can be a gas pathway for some shapes of the space 12. One example of such a permeable member is shown in FIG. 17. In permeable member 1 of FIG. 17, the space 12 penetrating from one end face to the other end face of the support 2 is formed in the support 2, and the space 12 constitutes a part of the gas pathway 11 of the permeable member 1. In this permeable member 1, the outer circumference plane of the support 2 can be in close contact with the inner circumference plane of the protective cover 8 along the whole circumference depending on the areas of the space 12. In this case, it is possible to prevent the protective cover 8 from dropping off during use.

Figure 18:
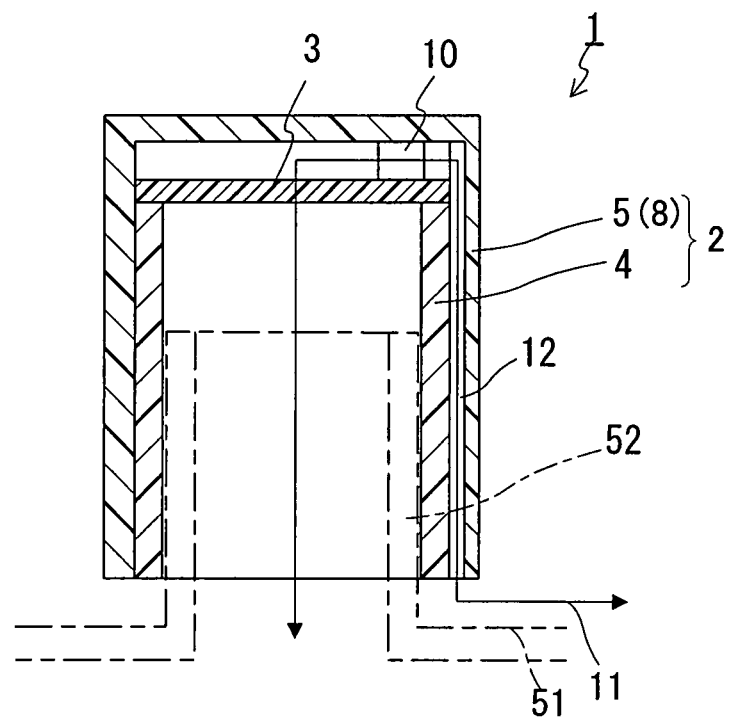
FIG. 18 is a sectional view showing one example of the permeable member, other than the above permeable members, of the present invention in a simplified manner.

Another example of the permeable member 1 of the present invention is shown in FIG. 18. The permeable member 1 shown in FIG. 18 is provided with the support 2 in which the space 12 that penetrates from one end face to the other end face of the support 2 is formed between the first resin part 4 and the second resin part 5. The permeable member 1 is provided also with the protective cover 8 that is integrated with the second resin part 5. In this permeable member 1, the space 12 can constitute a part of the gas pathway 11. In addition, since the first resin part 4 is integrated with the protective cover 8, it is possible to prevent the protective cover 8 from dropping off during use and it is also possible to downsize the permeable member further.

The shape of the protective cover 8 is not particularly limited, as long as it is difficult for outside foreign objects to contact with the permeable film 3. A through-hole may be formed in the bottom portion of the protective cover 8. When the through-hole is formed, the ventilation property can be improved. A protective layer consisting of a woven fabric, a nonwoven fabric, a net or the like may be placed at the opening of the through-hole. In this case, it is possible to decrease further the chances of the permeable film 3 contacting the foreign objects while the ventilation property is improved. The presence or absence of the through-hole in the protective cover 8 is selected arbitrarily depending on a circumstance in which the permeable member 1 is used. In some circumstances, it is preferable that the protective cover 8 in which no through-hole is formed is used. The protective cover 8 may be formed with using, for example, a resin, a metal, or the like.

Next, the permeable casing and the electrical component of the present invention will be described.

The permeable casing and the electrical component, of the present invention are characterized in that the permeable member 1 of the present invention is fixed to an opening of a casing. As described above, the permeable member 1 of the present invention is provided with a support including two or more resin materials that are different from each other in elastic modulus, and thereby the permeable member 1 can attain both the pullout strength and the following property (sealing property). Consequently, it is possible to downsize it and/or improve the ventilation property more, compared to a permeable member in which a radial thickness of a support is thickened or a ratio of an inside diameter of the support relative to an outside diameter of an opening is reduced, for example. Therefore, the permeable casing and the electrical component of the present invention can have more degrees of freedom for packaging while ensuring the ventilation property of the permeable member, for example.

The kinds of the permeable casing and the electrical component in which the permeable member of the present invention is fixed are not particularly limited. For example, electrical components such as a headlamp, rear lamp, fog lamp, turn lamp, back lamp, motor case, pressure sensor, pressure switch and ECU, and casings for electronic products such as a mobile-phone, camera, electric razor, electric toothbrush and lamp are mentioned. The number of the permeable member fixed to the casing is not particularly limited, and two or more permeable members may be fixed to two or more surfaces, or the same surface of the casing.

Figure 19A:
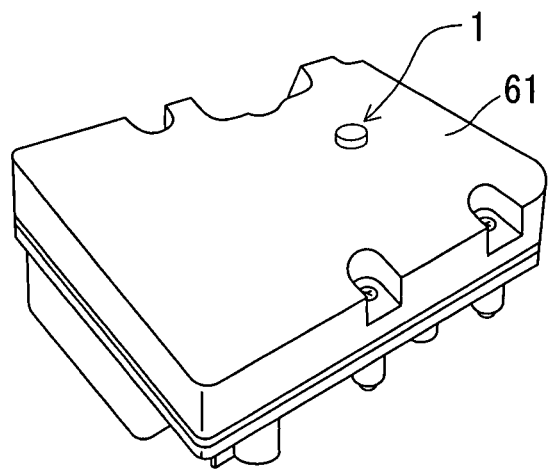
FIG. 19A is a perspective view showing one example of the permeable casing of the present invention.
Figure 19B:
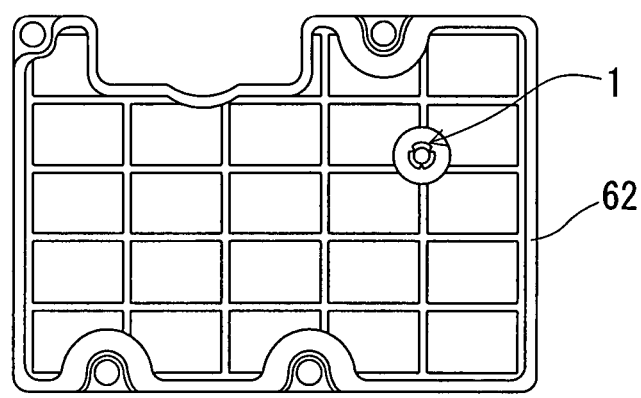
FIG. 19B is a plan view showing an inner face of one member constituting the permeable casing of FIG. 19A.
Figure 20:
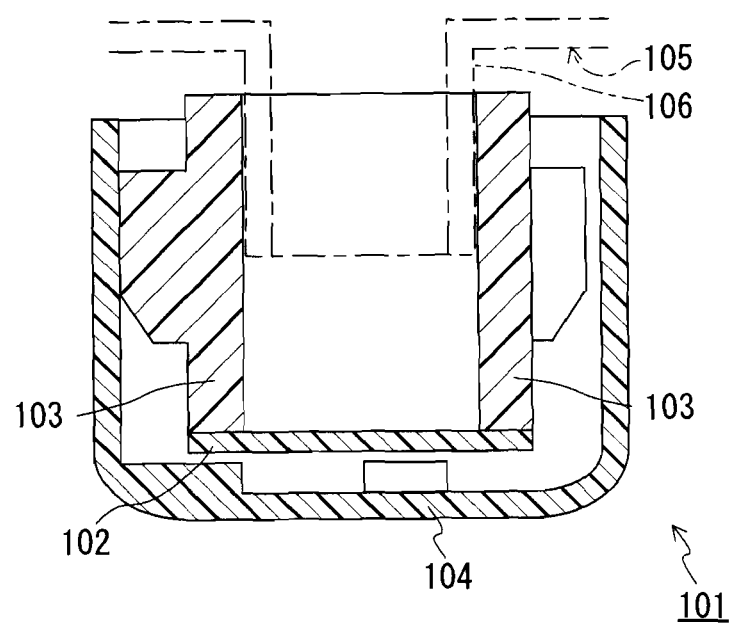
FIG. 20 is a sectional view showing one example of a conventional permeable member in a simplified manner.

One example of the permeable casing (electrical component) of the present invention is shown in FIG. 19A and FIG. 19B. In the ECU 61 of FIG. 19A, the permeable member 1 of the present invention is fixed to an opening in one member 62 constituting its casing, as shown in FIG. 19B.

Example

Hereinafter, the present invention is described in more detail with reference to Examples. The present invention is not limited to the following Examples.

In these Examples, cylindrical supports shown in FIG. 2 were molded, and the permeable members shown in FIG. 1 and FIG. 13 were produced by fixing and bonding a permeable film to an end face of the molded support. After that, evaluations of the pullout strength and sealing property on the produced permeable members were performed. First, each evaluation method will be described.

—Evaluation Method of Pullout Strength—

First, a columnar body (outside diameter: 8 mm) made of polypropylene was inserted into the inside of the support of the produced permeable member so that the insertion depth became 8 mm. After that, the columnar body was pulled out of the support using a tensile testing machine (pullout speed: 50 mm/min) and the maximum value of the force generated during pulling was determined as the pullout strength.

—Evaluation Method of Sealing Property—

The evaluation of the sealing property of the permeable member was carried out with a shower test. Specifically, the produced permeable member was fixed so as to cover an opening (outside diameter: 8 mm, inside diameter: 5 mm, height: 10 mm) of the casing (inner volume: 500 cm$^3$). Then, water was sprayed at a water spraying rate of 1 liter/min for 5 min, and the presence or absence of water intruding into the casing was confirmed.

Next, the production method of each sample used in these Examples will be described.

—Sample 1—

First, a cylindrical first resin part was molded using a thermoplastic elastomer (manufactured by Mitsui Chemicals, Inc.: Milastmer 6030, flexural modulus: $4.4 \times 10^8$ N/m$^2$) by an injection molding method. Next, the molded first resin part was loaded into a mold, and a cylindrical second resin part was molded using high-density polyethylene (manufactured by Chisso Corporation: J110K, flexural modulus: $9.8 \times 10^8$ N/m$^2$) so as to contact the outer circumference portion of the first resin part. Thereby the support shown in FIG. 2 was obtained. The inside diameter of the obtained support was 7.5 mm, the length of the support in the central axis direction was 12 mm, and the thickness was 2.5 mm (thickness of the first resin part: 1 mm, thickness of the second resin part: 1.5 mm). The value of the flexural modulus was measured according to a standard of ASTM (American Society for Testing and Materials) D 790.

Next, a permeable member shown in FIG. 1 was produced by fixing and bonding a laminate (cylindrical shape having the outside diameter of 14 mm, manufactured by NITTO DENKO CORPORATION: Microtex NTF1026-K02) of a film (thickness: 25 μm, average pore size: 0.6 μm, porosity: 85%) consisting of a polytetrafluoroethylene (PTFE) porous material as a permeable film and a nonwoven fabric (thickness: 130 μm), which is a reinforcing layer, to an end face of the support by thermal fusion bonding. During fixing and bonding, the reinforcing layer was brought into contact with the support, and they were retained at the pressure of $9.8 \times 10^4$ Pa at 190° C. for 10 seconds.

—Sample 2—

A permeable member was produced in a similar manner to Sample 1 except that a liquid-repellent treated film was used as a permeable film.

The liquid-repellent treated film was prepared as follows. First, a copolymer consisting of 40 mol % of alkyl methacrylate and 60 mol % of perfluoroalkyl methacrylate was dissolved in a solvent in which 100 parts by weight of toluene, 39 parts by weight of n-heptane, and 3.5 parts by weight of methyl acetate were mixed evenly, so that a treating solution (copolymer concentration: 5% by weight) was prepared. Next, the liquid-repellent treatment was performed by immersing a PTFE porous material for the permeable film similar to that in Example 1 into the prepared treating solution and by drying the PTFE porous material at 120° C. for 3 min. When kerosene was dropped onto the treated surface of the permeable film after the liquid-repellent treatment, no permeation of the kerosene into the permeable film was observed.

—Sample 3—

A protective cover shown in FIG. 14 was placed on a permeable member similar to Sample 1, and thereby a permeable member shown in FIG. 13 was produced. The protective cover (cylindrical shape having a bottom, inside diameter: 16 mm, outside diameter: 18 mm, length in the central axis direction: 10 mm, 3 convex portions were formed in the inner circumference portion, diameter of the circle which includes the three apexes of the convex portions: 11.5 mm) was molded by an injection molding using polypropylene (UBE INDUSTRIES, LTD: UBE Polypro J815HK). The permeable member similar to Sample 1 was inserted into the protective cover thus molded from an end face on which the permeable film was arranged, and thereby the permeable member shown in FIG. 13 was produced.

—Sample A (Conventional Example)—

A support having a similar size to Sample 1 was molded by an injection molding using only a thermoplastic elastomer (Mitsui Chemicals, Inc.: Milastmer 6030, flexural modulus: $4.4 \times 10^8$ N/m$^2$). A permeable member was produced by fixing and bonding a permeable film similar to that of Sample 1 to an end face of the molded support by thermal fusion bonding.

Evaluations of the pullout strength and sealing property on Samples 1 to 3 and Sample A, produced as above, were performed. The results are shown in Table 1 below.

TABLE 1

| | Sample No. | | | |
|---|---|---|---|---|
| | Sample 1 | Sample 2 | Sample 3 | Sample A (Conventional example) |
| Pullout strength (N) | 22 | 25 | 26 | 16 |
| Sealing property | No intrusion | No intrusion | No intrusion | No intrusion |

As shown in Table 1, comparing to Sample A which is provided with the support only consisting of the thermoplastic elastomer, the pullout strengths of Samples 1 to 3 could be improved while their sealing properties were maintained.

The present invention can be applied to other embodiments unless the present invention departs from its intention and essential features. The embodiments disclosed in this specification are explanatory in all senses and do not limit the present invention. The scope of the present invention is represented not by the above explanation but by accompanying claims, and encompasses all modifications which have a meaning and scope equivalent to the claims.

INDUSTRIAL APPLICABILITY

According to the present invention, a permeable member which can attain both the pullout strength and following property (sealing property), a permeable casing and an electrical component which are using this permeable member can be provided by the means that the permeable member is provided with a support including two or more resin materials that are different from each other in elastic modulus.

The permeable member of the present invention can be used for various casings without any particular limitation. As the permeable casing and the electrical component using a permeable member of the present invention, for example, electrical components such as a headlamp, rear lamp, fog lamp, turn lamp, back lamp, motor case, pressure sensor, pressure switch, and ECU, and products such as a mobile-phone, camera, electric razor, electric toothbrush, and lamp can be mentioned.

The invention claimed is:

1. A permeable member that is fixed to a casing so as to cover an opening of the casing, which comprises:
   a permeable film through which a gas, which passes through the opening of the casing to which the permeable member is fixed, passes; and
   a tubular support that supports the permeable film,
   wherein the permeable film is arranged on an end face of the tubular support,
   the end face is an upstream end face with respect to the gas flowing into the casing when the permeable member is fixed to the casing,
   the permeable member further comprises a protective cover that covers the permeable film, wherein the protective cover is supported by the tubular support at at least one portion of the tubular support selected from the group consisting of the end face thereof and an outer circumference plane thereof so that a space is formed between the permeable film and the protective cover,
   the tubular support includes a first resin part and a second resin part, the first resin part of the tubular support contacts the casing to which the permeable member is fixed,
   a material forming the second resin part has a higher elastic modulus than a material forming the first resin part, and
   the first resin part and the second resin part are laminated at least partly at a sidewall of the tubular support when viewed in a transverse section of the tubular support.

2. The permeable member according to claim 1, wherein the first resin part and the second resin part are laminated along whole circumference in the transverse section.

3. The permeable member according to claim 1, wherein the protective cover is supported by a convex portion formed in an outer circumference plane of the tubular support.

4. The permeable member according to claim 1, wherein the tubular support further comprises a third resin part that supports the protective cover,
   wherein an elastic modulus of a material forming the third resin part is smaller than the elastic modulus of the material forming the second resin part.

5. The permeable member according to claim 4, wherein the materials forming the first resin part and the third resin part are same.

6. The permeable member according to claim 1, wherein the permeable film comprises a porous material of a fluororesin.

7. The permeable member according to claim 6, wherein the fluororesin is polytetrafluoroethylene.

8. The permeable member according to claim 1, wherein the permeable film is a liquid-repellent treated film.

9. The permeable member according to claim 1, wherein air permeability of the permeable film is 1000 seconds or less in terms of Gurley number.

10. A permeable casing including an opening to which a permeable member is fixed, wherein the permeable member is the permeable member according to claim 1.

11. An electrical component comprising a casing, wherein the permeable member according to claim 1 is fixed to an opening of the casing of the electrical component.

* * * * *